United States Patent [19]

Liang et al.

[11] Patent Number: 6,093,616

[45] Date of Patent: Jul. 25, 2000

[54] METHOD OF MANUFACTURE OF STACKED GATE MOS STRUCTURE FOR MULTIPLE VOLTAGE POWER SUPPLY APPLICATIONS

[75] Inventors: Mong-Song Liang; Jin-Yuan Lee; Chue-San Yoo, all of Hsin-chu, Taiwan

[73] Assignee: Taiwan Semiconductor Manufacturing Company, Hsin-Chu, Taiwan

[21] Appl. No.: 09/075,366

[22] Filed: May 11, 1998

[51] Int. Cl.⁷ .................................................. H01L 21/20
[52] U.S. Cl. ............................................................ 438/396
[58] Field of Search .................................... 438/396, 397, 438/398, 399, 381

[56] References Cited

U.S. PATENT DOCUMENTS

| | | | |
|---|---|---|---|
| 3,897,282 | 7/1975 | White | 148/175 |
| 5,049,979 | 9/1991 | Hashemi et al. | 357/75 |
| 5,266,507 | 11/1993 | Wu | 437/41 |
| 5,324,676 | 6/1994 | Guterman | 437/43 |
| 5,604,367 | 2/1997 | Yang | 257/321 |
| 5,606,521 | 2/1997 | Koo et al. | 365/149 |
| 5,644,528 | 7/1997 | Kojima | 365/185.03 |

*Primary Examiner*—Charles Bowers
*Assistant Examiner*—Craig Thompson
*Attorney, Agent, or Firm*—George O. Saile; Stephen B. Ackerman; Graham J. Jones, II

[57] ABSTRACT

This method forms a capacitor structure on a semiconductor substrate for providing split voltages for semiconductor circuits by the following steps. Form an active area in the substrate serving as a lower capacitor plate for a bottom capacitor and then form a thin dielectric layer and field oxide regions on the substrate, and cover the dielectric layer with a capacitor plate over the active area to complete the bottom capacitor. Form a thick dielectric layer over the device and a via through the thick dielectric layer to the upper capacitor plate. Form a second lower plate for a top capacitor. Form an inter-layer dielectric layer over the second lower plate. Form an upper capacitor layer over the inter-layer dielectric layer to form a top capacitor with a different capacitance value from the bottom capacitor. The value of the capacitance can be varied by selection of the permittivity and/or thickness of the dielectric layer and by variation of the effective plate area of the top and bottom capacitors.

10 Claims, 4 Drawing Sheets

METHOD OF MANUFACTURE OF STACKED GATE MOS STRUCTURE FOR MULTIPLE VOLTAGE POWER SUPPLY APPLICATIONS

BACKGROUND OF THE INVENTION

1. Field of the Invention

This invention relates to making of power semiconductor input/output circuits and more particularly for multiple voltage applications and devices manufactured thereby.

2. Description of Related Art

U.S. Pat. No. 3,897,282 of White for a "Method of Forming Silicon Gate Device Structures with Two or More Gate Levels" describes the method for forming a gate device with two or more gate levels at Col. 1, lines 29–40, col. 2, line 63 to col. 3, line 2; FIGS. 4–7 and FIG. 9. White shows the general principle of forming a FET gate with multiple polysilicon layers separated by dielectric layers, but does not teach providing various power supply levels.

U.S. Pat. No. 5,324,676 of Guterman describes a "Method for Forming a Dual Thickness Dielectric Floating Gate Memory Cell."

U.S. Pat. No. 5,604,367 of Yang for "Compact EEPROM Memory Cell Having a Floating Gate Transistor with a Multilayer Gate Electrode" shows a method for forming a memory cell having a floating gate transistor with a multilayer gate electrode.

U.S. Pat. No. 5,606,521 of Kuo for "Electrically Erasable and Programmable Read Only Memory with Non-Uniform Dielectric Thickness" shows forming a memory cell with non-uniform dielectric thicknesses.

U.S. Pat. No. 5,644,528 of Kojima for "Non-Volatile Memory Having a Cell Applying to Multi-Bit Data Layered Floating Gate Architecture and Programming Method for the Same" shows a method of forming a multi-bit memory cell having multiple layered floating gate.

In the past the goal of providing multiple voltage power supplies has been achieved by the steps as follows:

1. Provide multiple gate dielectrics with different thicknesses to handle various external internal power supplies.
2. Regrow silicon oxides by performing a complicated process resulting in serious reliability issues.

SUMMARY OF THE INVENTION

An object of this invention is to eliminate the dual or triple gate dielectric process.

Another object of this invention is to relax product design constraints, and to provide better process reliability.

In accordance with this invention, a method is provided for manufacture of a device on a semiconductor substrate with a capacitor formed to provide split voltages for semiconductor circuits described by the following steps. Form an active area in the substrate serving as the lower capacitor plate of a bottom capacitor. Form a thin dielectric layer and field oxide regions over the substrate. Form a first upper capacitor plate, preferably composed of a first doped polysilicon layer, over the thin dielectric layer above the active area completing the bottom capacitor. Form a thick dielectric layer over the first upper capacitor plate. Form a via through the thick dielectric layer connecting to the first upper capacitor plate. Form a third capacitor plate, preferably composed of a second doped polysilicon layer, over the dielectric layer above the active area to complete the bottom capacitor. The third plate can also serve as a lower plate for a top capacitor. Form an inter-layer dielectric layer over the second plate. Form an upper capacitor layer, preferably composed of a third doped polysilicon layer, over the inter-layer dielectric layer to form a top capacitor with a different capacitance value from the bottom capacitor.

Preferably, the bottom capacitor has a first effective plate area and the top capacitor has a different effective plate area which provides the different capacitance value, and the voltage Veq across the upper and bottom capacitor connected in series between a source and reference potential is expressed by the equation as follows:

$$Veq = Vg1 + Vg2 = (Vcc - Vss); \text{ and}$$

the voltage Vg2 across the thin dielectric layer is expressed by the equation as follows:

$$Vg2 = (Vcc - Vss) * \frac{C_1}{(C_1 + C_2)}.$$

Preferably, the inter-layer dielectric layer is composed of a material selected from the group consisting of silicon oxide, silicon nitride and combinations thereof.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

We have found that capacitive voltage dividers can use different thicknesses of a gate oxide layer to provide different capacitance values leading to different voltages, but this is difficult to implement in a commercial manufacturing process because it requires use of more masking steps to provide the additional capacitance values.

The present invention is based upon the use of coupling capacitors with gate oxide layers having identical thickness throughout the chip, in which there are various voltage division ratios. We have solved the problem based upon the concept that by choosing various different ratios of capacitive areas in a divider circuit, it is possible to change the capacitance value of a given capacitor, which leads to a change in the voltage across the capacitors.

Figure 1A:
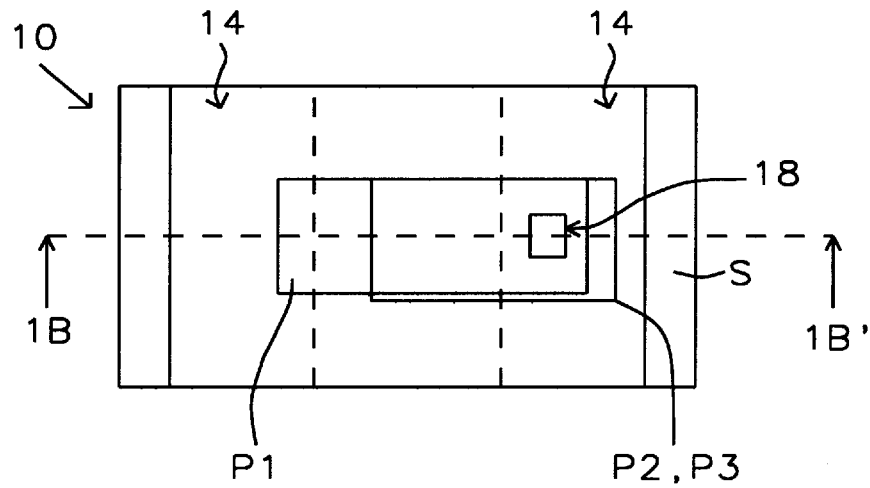
FIG. 1A shows a plan view of a device which is an embodiment of this invention formed on a silicon semiconductor substrate.

FIG. 1A shows a plan view of a device 10 which is an embodiment of this invention formed on a silicon semiconductor substrate S.

Figure 1B:
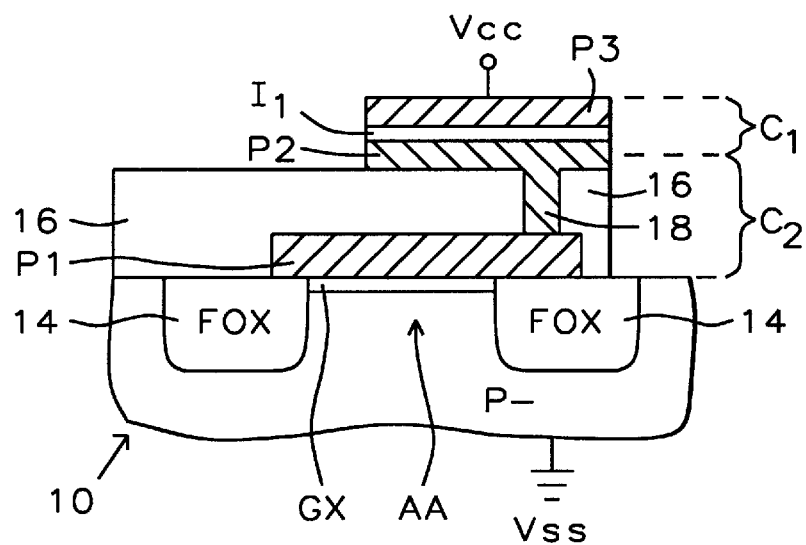
FIG. 1B shows a vertical sectional view of the device of FIG. 1A taken along line 1B–1B' in FIG. 1A.

FIG. 1B shows a vertical sectional view of the device 10 taken along line 1B–1B' in FIG. 1A.

Figure 1C:
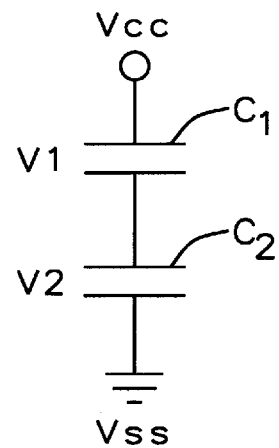
FIG. 1C shows an electrical schematic circuit diagram of the device of FIGS. 1A and 1B comprising a bottom capacitor and an top capacitor, which are shown connected in a series circuit between a voltage source and a reference potential.

FIG. 1C shows an electrical schematic circuit diagram of the device 10 comprising a bottom capacitor $C_2$ and an top capacitor $C_1$ which are shown connected in a series circuit between voltage source $V_{cc}$ and reference potential Vss. The circuit including the bottom capacitor $C_2$ and the top capacitor $C_1$ produces power voltages which can be used in semiconductor devices.

The supply voltage is $V_{cc}$. The voltage V1 is the voltage across the plates of the top capacitor $C_1$. The voltage V2 is the voltage across plates of the bottom capacitor $C_2$. The voltage Vss is the voltage at the ground end of the circuit comprising the silicon substrate S. An equation expressing the relationships of the voltages of the circuit of FIG. 1C is as follows:

$$Vcc = V1 + V2 \quad (1)$$

The capacitance $C_n$ of a capacitor n is expressed by a conventional equation, as follows:

$$C_n = \varepsilon_n \frac{A_n}{t_n} \quad (2)$$

where $A_n$    Effective area of the capacitor plates
$\varepsilon_n$    Permittivity of capacitor
$t_n$    Thickness of dielectric The conventional equation for the area of the capacitor based on equation (2) is as follows:

$$A_n = \frac{C_n * t_n}{\varepsilon_n} \quad (3)$$

Referring to FIG. 1B, the bottom capacitor $C_2$ includes the active area AA of substrate S which serves as the lower conductive plate of the first capacitor $C_2$, a dielectric layer GX and a first upper conductive plate P1 completing the first capacitor $C_2$. The first lower plate AA comprises the active area AA of substrate S doped with P– dopant. The dielectric layer GX comprises a thin gate oxide layer formed on the surface of the active area AA of substrate S. FOX (Field OXide) regions 14 are formed in the surface of substrate S surrounding the gate oxide layer GX. The first upper plate P1 is composed of a conductive (doped), polysilicon, electrode layer formed above gate oxide (silicon oxide) layer GX and FOX regions 14 formed of silicon oxide.

Stacked on first upper plate P1 is a dielectric layer 16 which is formed with an opening therethrough through which a via conductor 18 extends.

The top capacitor $C_1$ is composed of second lower conductive plate P2 and second upper conductive plate P3 having an Inter-Layer Dielectric (ILD) layer $I_1$ therebetween. Second lower conductive plate P2 and second upper conductive plate P3 are also composed of conductive (doped), polysilicon.

The top capacitor $C_1$ includes a second lower conductive plate P2 comprising another conductive (doped), polysilicon, electrode layer, Inter-Layer Dielectric (ILD) layer $I_1$ and a second upper conductive plate P3, comprising a third conductive (doped), polysilicon, electrode layer. In particular, above via 18 and dielectric layer 16 is formed the second lower layer P2 comprising the lower conductive plate of the top capacitor $C_1$.

Above the gate oxide layer GX, a first conductor layer P1 is formed composed of doped polysilicon. Above the first conductor layer P1, via 18 extends down from a second conductor layer P2 to the top surface of the first conductor layer P1. Second conductor layer P2 is formed on the top surface of the dielectric layer 16 in electrical contact with via 18.

An Inter-Layer Dielectric layer ILD is formed above the top surface of the second conductor layer P2.

A third conductor layer P3 is formed on the top surface of the dielectric layer ILD.

PROCESS

Figure 2:
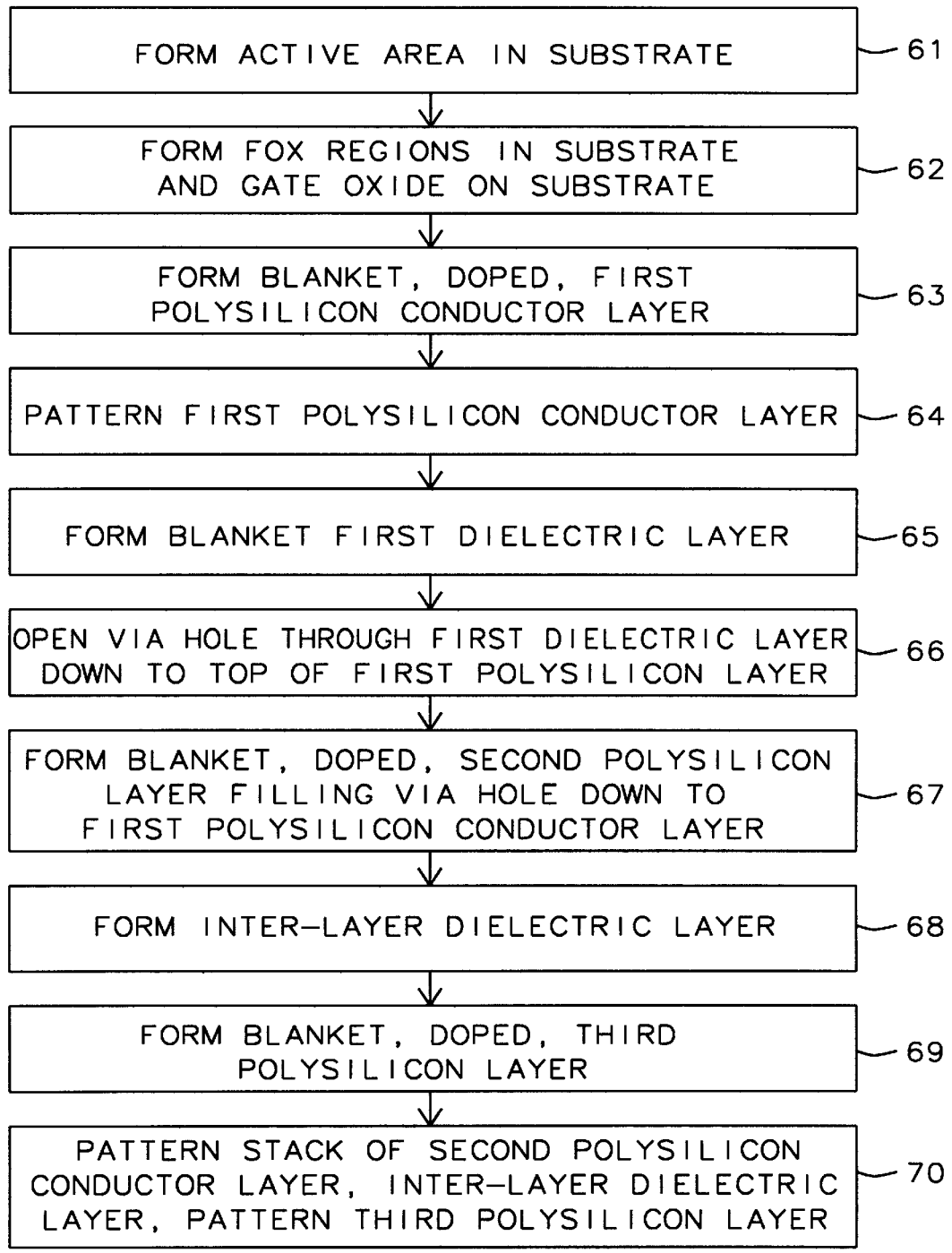
FIG. 2 is a flow chart describing manufacture of the device of FIGS. 1A–1C in accordance with the method of this invention.

The device of FIGS. 1A–1C is manufactured in accordance with the method of this invention in accordance with the flow chart shown in FIG. 2.

In the first step 61, the process begins with forming the active area AA in the P– doped silicon semiconductor substrate S.

In the second step 62, field oxide (FOX) regions 14 are formed aside from the active area AA in portions of the surface of substrate S. Aside from the FOX regions 14, a gate oxide (silicon dioxide) layer GX is formed on the surface of the substrate S. Gate oxide layer GX has a thickness from about 10 Å to about 100 Å.

In the third step 63, a doped first polysilicon conductor layer P1 is formed on the device 10 with a thickness from about 1,000 Å to about 4,000 Å.

In the fourth step 64, the first polysilicon conductor layer P1 is patterned by a photolithographic step followed by an etching step to form the structure P1 shown in FIGS. 1A and 1B which covers the gate oxide layer GX and extends across the top surfaces of FOX regions 14 on either side of gate oxide layer GX.

In the fifth step 65, the a blanket first dielectric layer 16 is formed covering the patterned first polysilicon conductor layer P1 and the surface of the substrate S. Dielectric layer 16 has a thickness from about 1,000 Å to about 10,000 Å.

In the sixth step 66, a via hole for via 18 is opened through the first dielectric layer 16 down to the top of the first polysilicon layer P1.

In the seventh step 67, a doped second polysilicon conductor layer P2 is formed on the device 10 with a thickness from about 500 Å to about 3,000 Å covering the first dielectric layer 16 and filling the via hole with via 18 which reaches down through the via hole to contact the first polysilicon layer P1 both mechanically and electrically.

In the eighth step 68, the Inter-Layer Dielectric (ILD) layer $I_1$ with an effective oxide thickness from about 40 Å to about 200 Å is formed above the top surface of the second conductor layer P2. The layer P2 is composed of doped polysilicon formed by the process of in-situ doped polysilicon or undoped polysilicon with a proper implant.

In the ninth step 69, a doped third polysilicon conductor layer P3 is formed on the device 10 with a thickness from about 500 Å to about 3,000 Å covering the Inter-Layer Dielectric layer $I_1$.

In the tenth step 70, the top capacitor $C_1$ stack is patterned by a photolithographic/etching step to form the structures of layers P2, $I_1$ and P3 shown in FIGS. 1A and 1B above the dielectric layer 16. The stack is formed from the second polysilicon conductor layer P2, Inter-Layer Dielectric layer $I_1$, and third polysilicon conductor layer P2 by forming a photolithographic mask followed by etching.

Figure 3A:
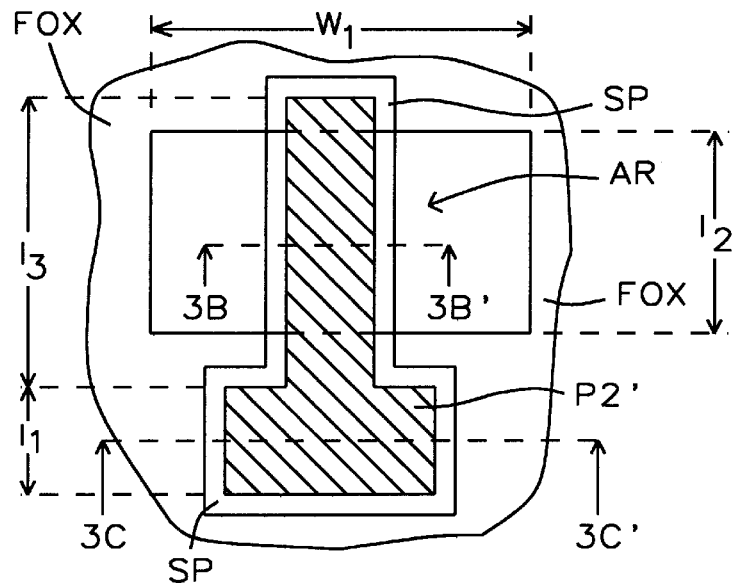
FIG. 3A shows a plan view of a device which is an embodiment of this invention formed on a silicon semiconductor substrate.

FIG. 3A shows a plan view of a device 40 which is an embodiment of this invention formed on a silicon semiconductor substrate S2. Substrate S2 includes an active region AR surrounded by a field oxide region FOX. Above substrate S2 and field oxide region FOX is a conductor stack (topped by polysilicon conductor plate P2' which overlies other layers as described below in FIG. 3A).

Figure 3B:
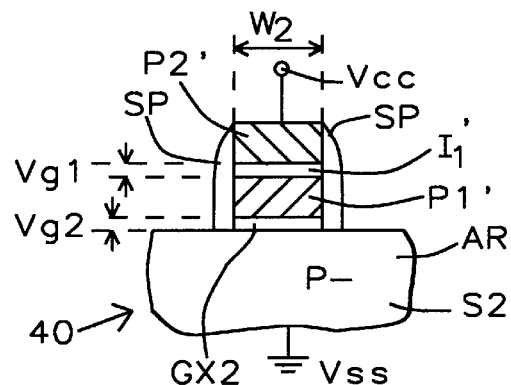
FIG. 3B shows a vertical sectional view of the device of FIG. 3A taken along line 3B–3B' in FIG. 3A.

FIG. 3B shows a vertical sectional view of the device 40 taken along line 3B–3B' in FIG. 3A.

Figure 3C:
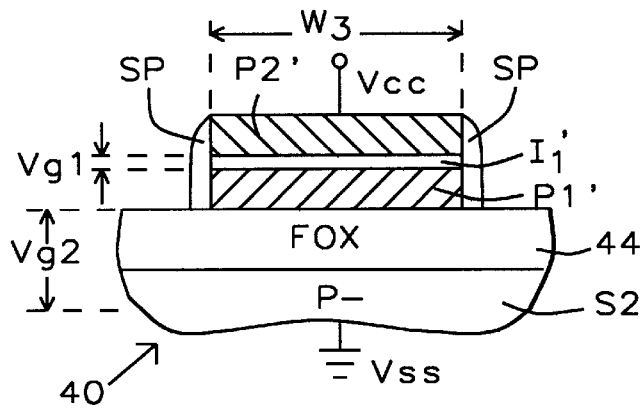
FIG. 3C shows a vertical sectional view of the device of FIG. 3A taken along line 3C–3C' in FIG. 3A.

FIG. 3C shows a vertical sectional view of the device 40 taken along line 3C–3C' in FIG. 3A.

Figure 3D:
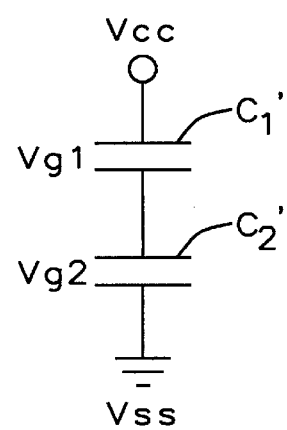
FIG. 3D shows an electrical schematic circuit diagram of the device of FIG. 3A comprising a bottom capacitor and an top capacitor which are shown be connected in a series circuit between a voltage source and a reference potential.

FIG. 3D shows an electrical schematic circuit diagram of the device 40 comprising a bottom capacitor $C_2$' and an top capacitor $C_1$' which are shown be connected in a series circuit between voltage source Vcc and reference potential Vss. The circuit including the bottom capacitor $C_2$' and the top capacitor $C_1$' produces two power voltages which can be used in semiconductor devices.

Referring to FIGS. 3B and 3C, the bottom capacitor $C_2$' includes a lower plate AR, a dielectric layer GX2 and an intermediate plate P1'. The top capacitor $C_1$' includes an intermediate plate P1', Inter-Layer Dielectric (ILD) layer $I_1$' and an upper plate P2'.

The lower plate of bottom capacitor $C_2$' comprises an active region AR in substrate S2, dielectric layer GX2 or Field OXide (FOX) region 44. The active region AR and the FOX regions 44 are formed in silicon semiconductor substrate S2 doped with P− dopant. The dielectric layer GX2 comprises a thin gate oxide layer formed on the surface of the substrate S2 and FOX regions 44 which are formed in the surface of substrate S2 aside from active region AR and gate oxide layer GX2. The intermediate plate P1' is composed of a conductive (doped), polysilicon, electrode layer formed above gate oxide (silicon oxide) layer GX and above FOX (Field OXide), silicon oxide, regions 14.

The top capacitor $C_1$' is composed of the intermediate plate P1', an Inter-Layer Dielectric (ILD) layer $I_1$' and upper plate P2' above ILD layer $I_1$'.

The top capacitor $C_1$' includes an intermediate plate P1', Inter-Layer Dielectric (ILD) layer $I_1$' and an upper plate P2', comprising a second conductive (doped), polysilicon, electrode layer. Here, the intermediate plate P1' comprises the lower plate of the top capacitor $C_1$', since it is common to both capacitors $C_1$' and $C_2$'.

Above the gate oxide layer GX2, a first conductor layer P1' is formed composed of doped polysilicon. Interlayer Dielectric layer $I_1$' is formed above the top surface of the intermediate conductor layer P1'. Upper plate layer P2' is composed of doped polysilicon that is formed on the top surface of the Inter-Layer Dielectric layer $I_1$'.

The active region AR is formed in substrate S2. Active region AR has an area A1 with width $W_1$ and length $l_2$. The portion of the capacitor stack which overlies the active region AR has an area A2 with width $W_2$ and length $l_2$ as can be seen in FIG. 3B. That is to say, the area of the plate of bottom capacitor $C_2$' comprising the overlapping area between intermediate plate P1' and the active area region AR has length $l_2$ and width $W_2$.

The capacitor stack formed of plate P1', ILD layer $I_1$' and upper plate P2' is comprised of two areas A3 and A4. Area A3 has width $W_2$ and length $l_3$ formed over the active region AR and extending over field oxide regions FOX. Area A4 has width $W_3$ and length $l_1$ formed over the field oxide regions FOX as can be seen in FIG. 3A. It can be seen that area A3 alone is greater than area A2. Adding area A4 to area A3 assures that the capacitance of capacitor $C_1$' is far larger than the capacitance of bottom capacitor $C_2$' simply because of the area difference assuming that the dielectric values and thicknesses of layers GX2 and $I_1$' are similar.

PROCESS

Figure 4:
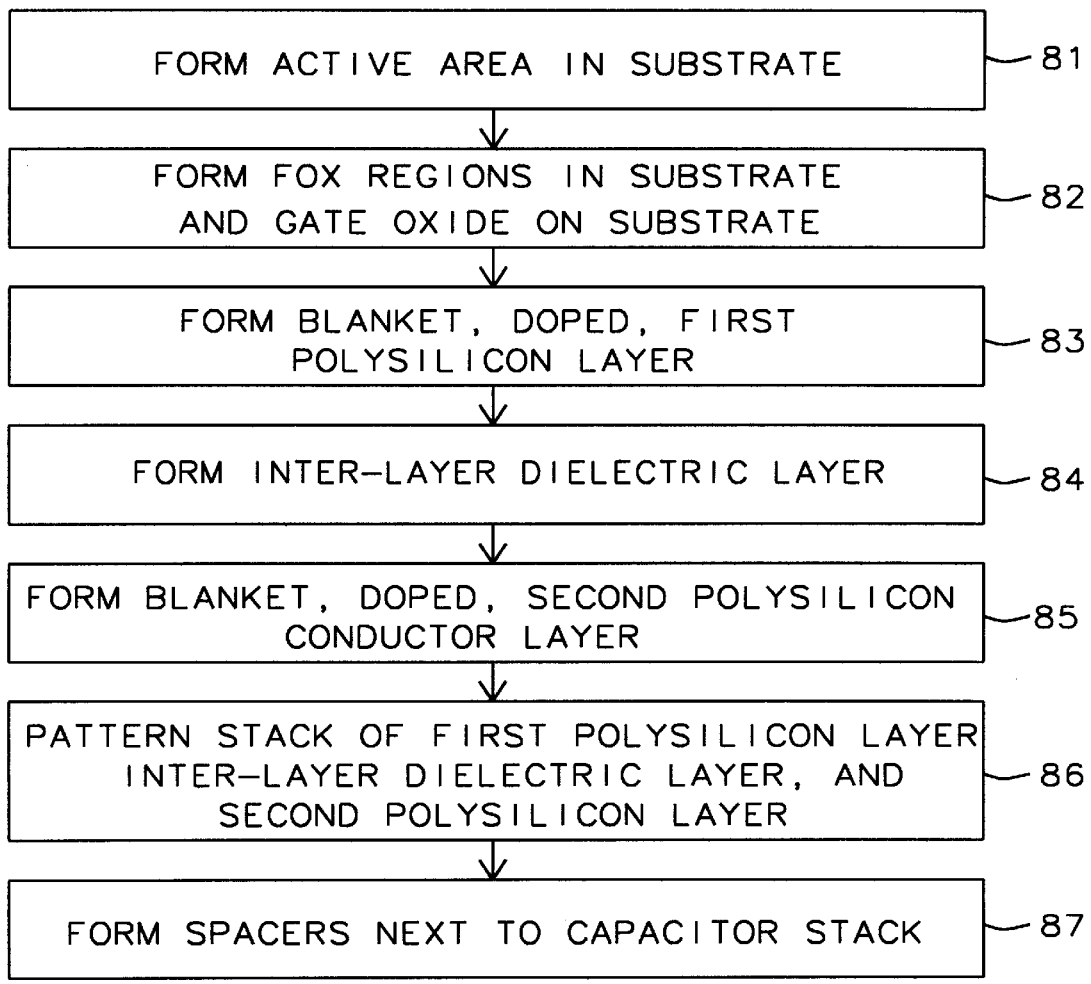
FIG. 4 is a flow chart describing manufacture of the device of FIGS. 3A–3D in accordance with the method of this invention.

The device of FIGS. 3A–3D is manufactured in accordance with the method of this invention in accordance with the flow chart shown in FIG. 4.

In the first step 81, the process begins with P− doped silicon semiconductor substrate S2.

In the second step 82, Field oxide (FOX) region 44 is formed in portions of the surface of substrate S2 aside from the active area region AR. Inside from the FOX region 44, a gate oxide (silicon dioxide) layer GX2 is formed on the surface of the substrate S2 over active region AR. Gate oxide layer GX has an effective thickness from about 10 Å to about 100 Å.

In the third step 83, a doped first polysilicon conductor layer P1' is formed over gate oxide layer GX and field oxide region FOX. The doped first polysilicon conductor layer P1' has a thickness from about 1,000 Å to about 4,000 Å.

In the fourth step 84, the Inter-Layer Dielectric layer (ILD) $I_1$' with an effective oxide thickness from about 40 Å to about 200 Å is formed above the top surface of the first polysilicon conductor layer P1'. The ILD layer $I_1$' is composed of silicon oxide or silicon nitride, etc. formed by the process of CVD (Chemical Vapor Deposition).

In the fifth step 85, a doped second polysilicon conductor layer P2' is formed on the device 40 with a thickness from about 500 Å to about 3,000 Å covering the Inter-Layer Dielectric layer $I_1$'.

In the sixth step 86, the capacitor stack of the second polysilicon conductor layer P2', Inter-Layer Dielectric layer $I_1$', and second polysilicon conductor layer P2' are patterned by a photolithographic step followed by an etching step to form the structures of P2', $I_1$' and P1', as shown in FIGS. 3A, 3B and 3C above the dielectric layer GX2 and FOX region 44.

In the seventh step 87, spacers SP are formed adjacent to the sidewalls to the capacitor stack as shown in FIGS. 3B and 3C.

The relationships of the voltages, areas, permittivity and dielectric thickness are expressed in the equations as follows:

$$Veq = Vg1 + Vg2 = (Vcc - Vss) \quad (4)$$

$$Vg2 = (Vcc - Vss) * \frac{C_1}{(C_1 + C_2)} \quad (5)$$

$Vg1$ = voltage drop across interelectrode dielectric layer
$Vg2$ = voltage drop for thin gate oxide $$C_1 = [A_1 \text{ Area of polysilicon}] * \frac{\varepsilon_1}{t_1} \quad (6)$$

$$C_2 = \left[ A_2 \frac{\text{area of polysilicon}}{\text{on active region}} \right] * \frac{\varepsilon_2}{t_2} \tag{7}$$

The changes that can be made to vary the capacitance are, as follows:

1. The area $A_1$ can be changed;
2. Thicknesses $t_1$ and $t_2$ of the capacitive dielectrics can be changed;
3. The dielectric material can be changed from $SiO_2$ to $Si_3N_4$, or changed to a combination of both $SiO_2$ and $Si_3N_4$, etc. to change the permittivity.

Advantages of the Embodiment

1. The stacked gate MOS structure has the proper capacitance coupling ratio.
2. The high voltage at the I/O (Input/Output) connections and the internal high-voltage circuits are scaled down by the stacked gate structure.

Commercial Applicability of Invention

A stacked gate MOS structure in accordance with this invention can be employed for multi-power supply applications.

This invention is applicable to Input/Output (I/O) circuit logic such as DRAM and SRAM devices. The invention is applicable to DRAMs because three polysilicon layers such as P2 and P3 shown in FIG. 1B are available.

The problem is that customers require on the same chip several voltages such as

V0=5.0,
V1=3.3 V or
V2=2.5 V, and in the future:

V4=1.8, or
V5=1.2 V, etc.

This invention is capable of being implemented with various capacitor arrangements based upon various different areas of the plates of series capacitor circuits to yield the voltage listed above by varying the ratios of effective areas of the capacitor plates on the successive layers.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor device on a semiconductor substrate on which a capacitor is formed to provide split voltages for semiconductor circuits comprising:

forming an active area in said substrate,
forming a thin dielectric layer and field oxide regions over said substrate,
forming an intermediate capacitor layer over said dielectric layer above said active area to form a bottom capacitor,
forming an inter-layer dielectric layer over said intermediate capacitor layer, and
forming an upper capacitor layer over said inter-layer dielectric layer to form an top capacitor with a different capacitance value from said bottom capacitor.

2. A method in accordance with claim 1 wherein said bottom capacitor has a first effective plate area and said top capacitor has a different effective plate area which provides said different capacitance value.

3. A method in accordance with claim 1 wherein the voltage Veq across the upper and bottom capacitor connected in series between a source and reference potential is expressed by the equation as follows:

Veq=Vg1+Vg2=(Vcc−Vss); and the voltage Vg2 across the said thin dielectric layer is expressed by the equation as follows:

$$Vg2 = (Vcc - Vss) * \frac{C_1}{(C_1 + C_2)}.$$

4. A method in accordance with claim 1 wherein said bottom capacitor has a first effective plate area and said top capacitor has a different effective plate area which provides said different capacitance value, and the voltage Veq across said top and bottom capacitors connected in series between a source and reference potential is expressed by the equation as follows:

Veq=Vg1+Vg2=(Vcc−Vss); and the voltage Vg2 across the said thin dielectric layer is expressed by the equation as follows:

$$Vg2 = (Vcc - Vss) * \frac{C_1}{(C_1 + C_2)}.$$

5. A method in accordance with claim 1 wherein:

said inter-layer dielectric layer is composed of a material selected from the group consisting of silicon oxide, silicon nitride and combinations thereof.

6. A method of manufacture of a semiconductor device on a semiconductor substrate on which a capacitor is formed to provide split voltages for semiconductor circuits comprising:

forming an active area in said substrate serving as a lower capacitor plate for a bottom capacitor,
forming a thin dielectric layer and field oxide regions over said substrate,
forming a via through said thick dielectric layer to said first upper capacitor plate,
forming a second capacitor plate over said dielectric layer above said active area to complete said bottom capacitor,
forming a thick dielectric layer over said device,
forming a third plate serving as the lower plate for a top capacitor,
forming an inter-layer dielectric layer over said second lower plate, and
forming an upper capacitor plate layer over said inter-layer dielectric layer to complete a top capacitor with a different capacitance value from said bottom capacitor.

7. A method in accordance with claim 6 wherein said bottom capacitor has a first effective plate area and said top capacitor has a different effective plate area which provides said different capacitance value.

8. A method in accordance with claim 6 wherein the voltage Veq across the upper and bottom capacitor connected in series between a source and reference potential is expressed by the equation as follows:

Veq=Vg1+Vg2=(Vcc−Vss); and the voltage Vg2 across the said thin dielectric layer is expressed by the equation as follows:

$$Vg2 = (Vcc - Vss) * \frac{C_1}{(C_1 + C_2)}.$$

9. A method in accordance with claim 6 wherein said bottom capacitor has a first effective plate area and said top capacitor has a different effective plate area which provides said different capacitance value, and the voltage Veq across the upper and bottom capacitor connected in series between a source and reference potential is expressed by the equation as follows:

Veq=Vg1+Vg2=(Vcc−Vss); and the voltage Vg2 across the said thin dielectric layer is expressed by the equation as follows:

$$Vg2 = (Vcc - Vss) * \frac{C_1}{(C_1 + C_2)}.$$

10. A method in accordance with claim 6 wherein said inter-layer dielectric layer is composed of a material selected from the group consisting of silicon oxide, silicon nitride and combinations thereof.

* * * * *